(12) United States Patent
Teplechuk

(10) Patent No.: US 9,197,200 B2
(45) Date of Patent: Nov. 24, 2015

(54) DYNAMIC LEVEL SHIFTER CIRCUIT

(71) Applicant: Dialog Semiconductor GmbH, Kirchheim/Teck-Nabern (DE)

(72) Inventor: Mykhaylo Teplechuk, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

(21) Appl. No.: 14/277,269

(22) Filed: May 14, 2014

(65) Prior Publication Data

US 2014/0340136 A1 Nov. 20, 2014

Related U.S. Application Data

(60) Provisional application No. 61/824,099, filed on May 16, 2013.

(51) Int. Cl.
H03K 5/00 (2006.01)
H03K 3/356 (2006.01)
H03K 19/0185 (2006.01)

(52) U.S. Cl.
CPC ...... *H03K 3/356182* (2013.01); *H03K 3/35613* (2013.01); *H03K 19/018592* (2013.01)

(58) Field of Classification Search
None
See application file for complete search history.

(56) References Cited

U.S. PATENT DOCUMENTS

| 6,600,679 | B2 * | 7/2003 | Tanzawa et al. | 365/189.11 |
| 7,940,108 | B1 * | 5/2011 | Wang et al. | 327/333 |
| 2004/0232944 | A1 | 11/2004 | Bu et al. | |
| 2005/0057296 | A1 | 3/2005 | Dharne et al. | |
| 2008/0317106 | A1 * | 12/2008 | Leung et al. | 375/220 |
| 2009/0212842 | A1 | 8/2009 | Illegems et al. | |
| 2012/0139609 | A1 * | 6/2012 | Putter | 327/337 |
| 2012/0280739 | A1 | 11/2012 | Foley | |
| 2012/0294095 | A1 | 11/2012 | Shiu | |

OTHER PUBLICATIONS

"Nanosecond Delay Floating High Voltage Level Shifters in a 0.35 μm HV-CMOS Technology," by Yashodhan Moghe, et al., IEEE Journal of Solid-State Circuits, vol. 46, No. 2, Feb. 2011, pp. 485-497.

"Low-Power Static and Dynamic High-Voltage CMOS Level-Shifter Circuits," by Maziyar Khorasani, et al., 2008 IEEE, May 18, 2008, pp. 1946-1949, 978-1-4244-1684-4/08.

European Search Report 14368024.7-1810 Sep. 25, 2014, Dialog Semiconductor GmbH.

* cited by examiner

*Primary Examiner* — Long Nguyen

(74) *Attorney, Agent, or Firm* — Saile Ackerman LLC; Stephen B. Ackerman

(57) ABSTRACT

A level shifter does not require any DC (standby) current consumption and has a fast operation with low propagation delay. The level shifting from input to output voltage ranges is performed by a pair of level shifting capacitors. The input-output power voltages domains are unrestricted and flexible. DC isolation is deployed between power domains. Symmetrical rise/fall times are without duty cycle distortion. Over voltage stress is reduced by using metal capacitors. Finally the level shifter does not use high-voltage devices for level shifting purpose. Embodiments of level shifters provide one-way level shifting and bi-directional level shifting.

19 Claims, 11 Drawing Sheets

DYNAMIC LEVEL SHIFTER CIRCUIT

BACKGROUND

1. Technical Field

The present document relates to electronic circuits. In particular, the present document relates to dynamic level shifter circuits utilizing coupling capacitances and cross coupled latches.

2. Background

It is common that some power management systems use independent power voltage domains. Voltages in such power domains may not be related to each other and careful level shifting strategy is required. Level shifters are converting an input signal e.g. from a first operating voltage range having a first ground potential and a first supply potential into an output signal out in a second operating voltage range having a second ground potential and a second supply potential. For example input VDD (regulated to 5V) can be regulated by an LDO that is supplied (connected) to Vpwr voltage. And Vpwr can be directly connected to the unregulated battery voltage (one/two/three cell battery voltages) for example with specification of 4.2-12.6V if connected together. VSS2 can be also regulated, for example (Vpwr-5V). During operation as battery voltage (Vpwr) decay VSS2 can approach regulated VDD or it can be below VDD if VDD is supplied externally. Conventional level shifters may stop operation under such conditions.

It is a challenge for the designers of level shifters to overcome the drawbacks cited above.

SUMMARY

A principal object of the present disclosure is to design a dynamic level shifter having no DC (standby) consumption.

A further object of the disclosure is to achieve fast operation with low propagation delay.

A further object of the disclosure is to achieve unrestricted (flexible) input-output power voltages domains A further object of the disclosure is to achieve DC isolation between power domains.

A further object of the disclosure is to achieve symmetrical rise/fall times without signal or duty cycle distortions.

Furthermore an object of the disclosure is to reduce overvoltage stress by deploying metal-insulator-metal capacitors or any other suitable capacitor type.

Furthermore an object of the disclosure is to avoid using high-voltage (HV) devices for level shifting purpose.

Furthermore an object of the disclosure is to deploy level shifting capacitors and cross-coupled latches.

Furthermore an object of the disclosure is to reduce overvoltage stress by deploying metal-insulator-metal capacitors or any other suitable capacitor type.

Furthermore an object of the disclosure is to avoid using high-voltage (HV) devices for level shifting purpose.

Moreover an object of the invention is to continue operation of the level shifter when input and output voltage domains do not relate to each other.

In accordance with the objects of this disclosure a circuit capable of dynamic bi-directional level shifting has been achieved. The circuit disclosed firstly comprises: A circuit capable of dynamic bi-directional level shifting, comprising: two power domains, wherein each power domain is capable of receiving input signals, which are outputted by the other power domain, or providing output signals, which are inputted by the other power domain, comprising: two ports for a supply voltage, wherein the supply voltages of each power domain may be different, ports for signal inputs, and ports for signal outputs. Furthermore each power domain comprises a circuitry capable of holding a state of a last transition of a signal, wherein each circuitry is connected to the ports of its power domain and a first terminal of the circuitry is connected to a first capacitor and a second terminal of the circuitry is connected to a second capacitor. Moreover the circuit comprises said first capacitor configured to decoupling said first terminals of said circuitries and said second capacitor configured to decoupling said second terminals of said circuitries. It should be noted that the input and output signals of both power domains are configured to switch between an upper and a lower level of the supply voltage of the respective power domain.

In accordance with the objects of this disclosure a circuit capable of dynamic bi-directional level shifting has been achieved. The circuit disclosed firstly comprises: a first power domain comprising two ports for a first supply voltage configured to supplying the first power domain, a first port for signal input, wherein the port is connected to an input terminal of a first inverter, a second port for signal input wherein the port is connected to an input terminal of a second inverter, a first port for signal output wherein the port is connected to an output terminal of a third inverter, and a second port for signal output wherein the port is connected to an output terminal of a fourth inverter. Furthermore the first power domain comprises said first inverter, capable of buffering input signals from the first port for signal input, wherein the inverter is configured to be enabled by an enable signal if input signals are applied to the first port for signal input, said second inverter, capable of buffering input signals from the second port for signal input, wherein the inverter is configured to be enabled by an enable signal if input signals are applied to the second port for signal input, said third inverter, capable of buffering output signals to the first port for signal output, wherein the inverter is configured to be enabled by an enable signal if input signals are applied to a third port for signal input, said fourth inverter, capable of buffering output signals to the second port for signal output, wherein the inverter is configured to be enabled by an enable signal if input signals are applied to a fourth port for signal input, and a latch capable of holding a state of a last transition of a signal, wherein a first terminal of the latch is connected to a first terminal of a first capacitor, to an output terminal of said first inverter, and to an input terminal of the third inverter and wherein a second terminal of the latch is connected to a first terminal of a second capacitor, to an output terminal of said second inverter, and to an input terminal of the third inverter. Furthermore the circuit comprises a second power domain comprising two ports for a second supply voltage configured to supplying the second power domain, a third port for signal input, wherein the port is connected to an input terminal of a fifth inverter, a fourth port for signal input wherein the port is connected to an input terminal of a sixth inverter, a third port for signal output wherein the port is connected to an output terminal of a seventh inverter, a fourth port for signal output wherein the port is connected to an output terminal of an eighth inverter. Furthermore the second power domain comprises said fifth inverter, capable of buffering input signals from the third port for signal input, wherein the inverter is configured to be enabled by an enable signal if input signals are applied to the third port for signal input, said sixth inverter, capable of buffering input signals from the fourth port for signal input, wherein the inverter is configured to be enabled by an enable signal if input signals are applied to the third port for signal input, said seventh inverter, capable of buffering output signals to the third port for signal output, wherein the inverter is configured to be enabled by an enable signal if input signals are applied to the first port for signal input, said eighth inverter, capable of buffering output signals to the fourth port for signal output, wherein the inverter is configured to be enabled by an enable signal if input signals are applied to the second port for signal input, and a latch capable of holding a state of a last transition of a signal, wherein a first terminal of the latch is connected to a second terminal of the first capacitor, to an output terminal of said fifth inverter, and to an input terminal of the seventh inverter and wherein a second terminal of the latch is connected to a second terminal of the second capacitor, to an output terminal of said sixth inverter, and to an input terminal of the eighth inverter. More over the circuit comprises said first and second capacitor.

In accordance with the objects of this disclosure a method for dynamic bi-directional level shifting has been achieved. The method disclosed comprises the steps of: (1) providing a first and a second power domain, wherein each power domain comprises ports for an own supply voltage, and signal input and output ports, signal buffering inverters connected to their correspondent input or output ports and operating in the specific power supply domain and a latch capable of holding a state of a last transition of a signal, wherein both power domains are connected by two level shifting capacitors, wherein each capacitor connects correspondent terminals of the both latches, wherein input and output signals of the first power domain are referenced by a range of the supply voltage of the first power domain and wherein input and output signals of the second power domain are referenced by a range of the supply voltage of the second power domain, and (2) disabling inverters of the power domain receiving input signals, which are connected to output ports and inverters of the power domain providing output signals, which are connected to input ports, and enabling inverters of the power domain receiving input signals, which are connected to input ports and inverters of the power domain providing output signals, which are connected to output ports. Furthermore the method disclosed comprises the steps of (3) shifting alternately each signal level shifting capacitor by each edge of the input signal of the power domain receiving input signals from the upper voltage level to a lower voltage level or from a lower voltage level to the upper voltage of the power domain providing input and (4) providing the level shifted signal to the power domain providing the output signals wherein the inverters of the power domain providing output switch either to the upper or to the lower voltage level of their supply range and the latch of the power domain providing output signals holds a state of the signal until a next transition of a signal.

In accordance with the objects of this disclosure a circuit capable of dynamic one-directional level shifting has been achieved. The circuit disclosed firstly comprises an input power domain capable of receiving input signals comprising: two ports for a first supply voltage configured to supplying the input power domain, a port for input signals, wherein the signal input port is connected to a buffering means, said buffering means capable of buffering input signals, wherein a first buffering means is connected to a first terminal of an input memory element and a second buffering means is connected to a second terminal of the input memory element, wherein both buffering means are connected in series, and said input memory element capable of holding a state of a last transition of an input signal, wherein the first terminal of the input memory element is connected to a first capacitor and the second terminal of the input memory element is connected to a second capacitor, wherein the input signals of the input power domain are configured to switch between an upper and a lower level of the supply voltage of the input power domain.

Secondly the circuit comprises an output power domain capable of receiving input signals comprising: two ports for a second supply voltage configured to supplying the output power domain, two ports for output signals, wherein each of the output signal port is connected to an own buffering means, said buffering means capable of buffering output signals, wherein a buffering means of a first output port is connected to a first terminal of an output memory element and a second buffering means is connected to a second terminal of the output memory element wherein both buffering means are connected in series, and said output memory element capable of holding a state of a last transition of an output signal, wherein the first terminal of the output memory element is connected to the first capacitor and the second terminal of the memory element is connected to the second capacitor, wherein the output signals of the output power domain are configured to switch between an upper and a lower level of the supply voltage of the output power domain. Furthermore the circuit comprises said first capacitor configured to decoupling said first terminals of the input and output memory elements, and said second capacitor configured to decoupling said second terminals of the input and output memory elements.

SHORT DESCRIPTION OF THE FIGURES

The invention is explained below in an exemplary manner with reference to the accompanying drawings, wherein FIG. 1 illustrates a simplified circuit diagram of a dynamic level shifter of the present disclosure.

FIG. 2 shows simulation results of the level shifter showing input and output signals for full scale PWM modulated input ramp and level shifter reset signals FIG. 3 depicts simulation results of the level shifter showing input and output signals for full scale PWM modulated input ramp and signals on bottom and top plate of the level shifting capacitors FIG. 4 illustrates simulation results of the level shifter showing transient response time between input and output signals and signals on bottom and top plate of the level shifting capacitors.

DETAILED DESCRIPTION

Level shifting circuits and methods are disclosed. Preferred embodiments described in detail comprise level shifters applied in high voltage power systems.

It should be noted that the application of these level shifters is not limited to high voltage power systems. Presented level shifting method and apparatus can be used also in deep submicron technologies to provide effective level-shifting between power domains or any other system requiring level shifting.

Figure 1:
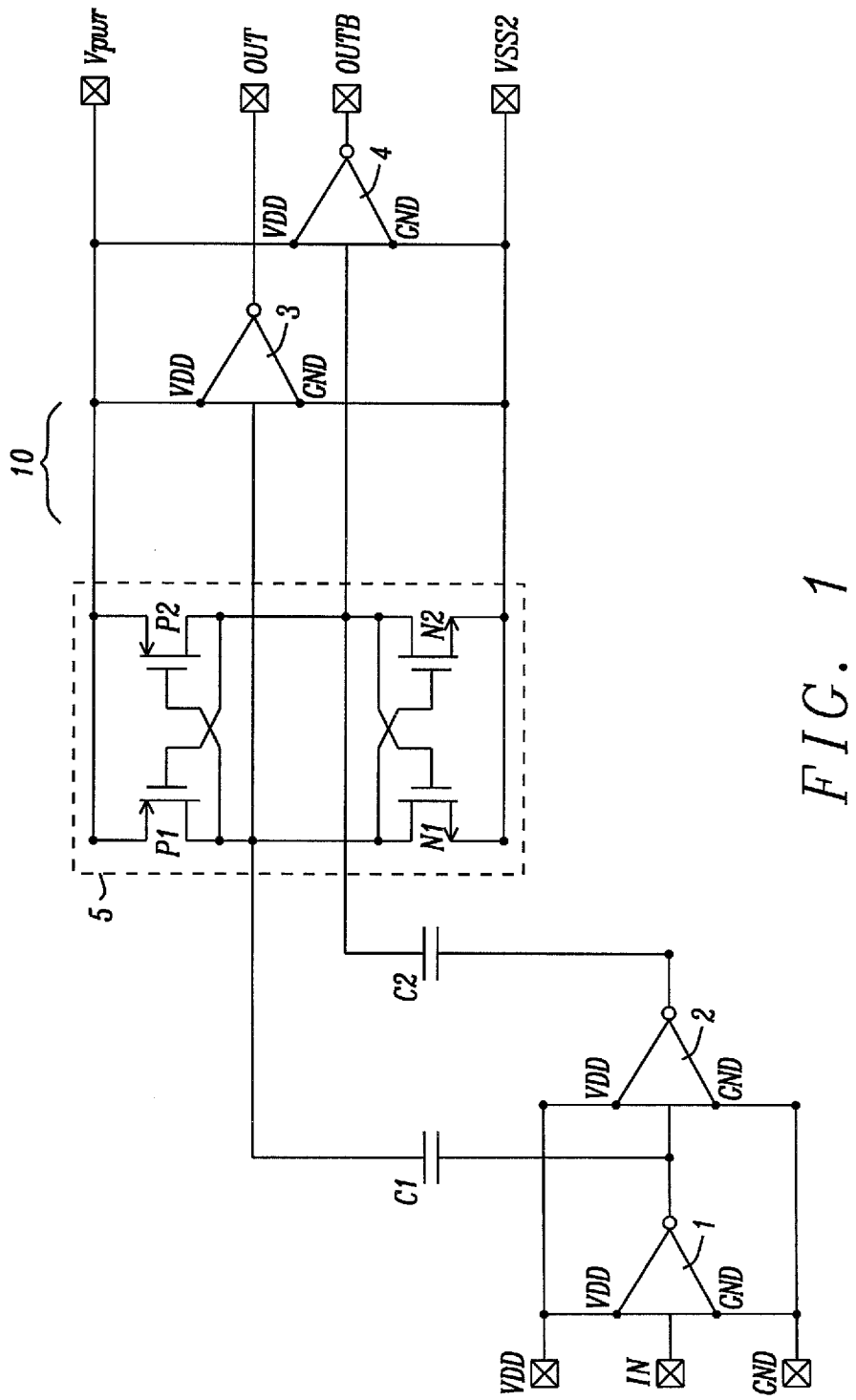
Figure 8:
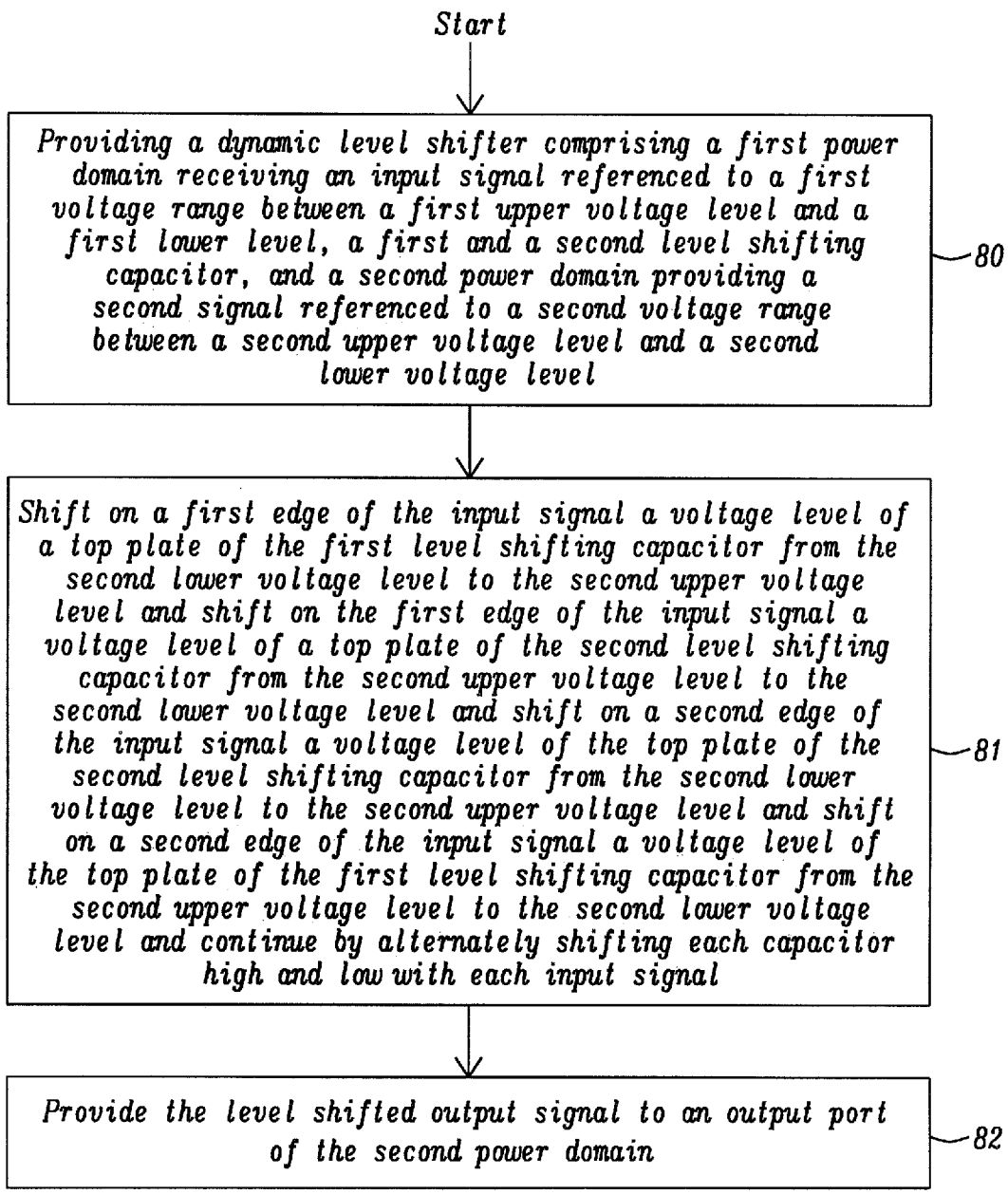
FIG. 8 illustrates a flowchart of a method to achieve a dynamic level shifter utilizing level shifting capacitors.

A dynamic level shifter 10 disclosed is illustrated in FIG. 1. Level shifting is achieved by charging and discharging level shifting capacitors C1 and C2 between input VDD and GND terminals. Capacitors C1 and C2 are charged by the input signal buffers/inverters 1 and 2. Input signal IN is a signal referenced to VDD and GND levels. The output signals OUT and OUTB are referenced to Vpwr and VSS2 power domain. The first terminals of the level shifting capacitors C1 and C2 are connected to the input signals via buffers/inverters 1 and 2. The second terminals of the level shifting capacitors C1 and C2 are connected to the latch 5 formed by the cross coupled P1, P2 and N1, N2 devices. It has to be understood that the type of latch 5 shown in FIG. 1 is an example only. Other types of latches, e.g. the type of latch shown in FIG. 6, could be used as well. Latch P1, P2 and N1, N2 is required to have reset, it is not shown in circuit diagram of FIG. 1 for simplicity. Outputs of the latch are buffered through inverters 3 and 4 in the Vpwr/VSS2 domain. FIG. 8 shows a similar level shifter is shown for reverse operation from VPwr/VSS2 to VDD/GND.

The main function of the latch is to hold output state of the last transition of the input signal. The input signal is coupled to the latch and once input transitions from one state (for example from 0 to 1) this state will be coupled to the output latch and the latch will hold and not change this state until next transition of the input signal.

To avoid voltage overstress on any of the active devices levels shifting capacitors C1 and C2 may be implemented for example by metal capacitors or any other appropriate types of capacitor that can withstand overstress voltage (i.e. Vpwr).

Figure 5:
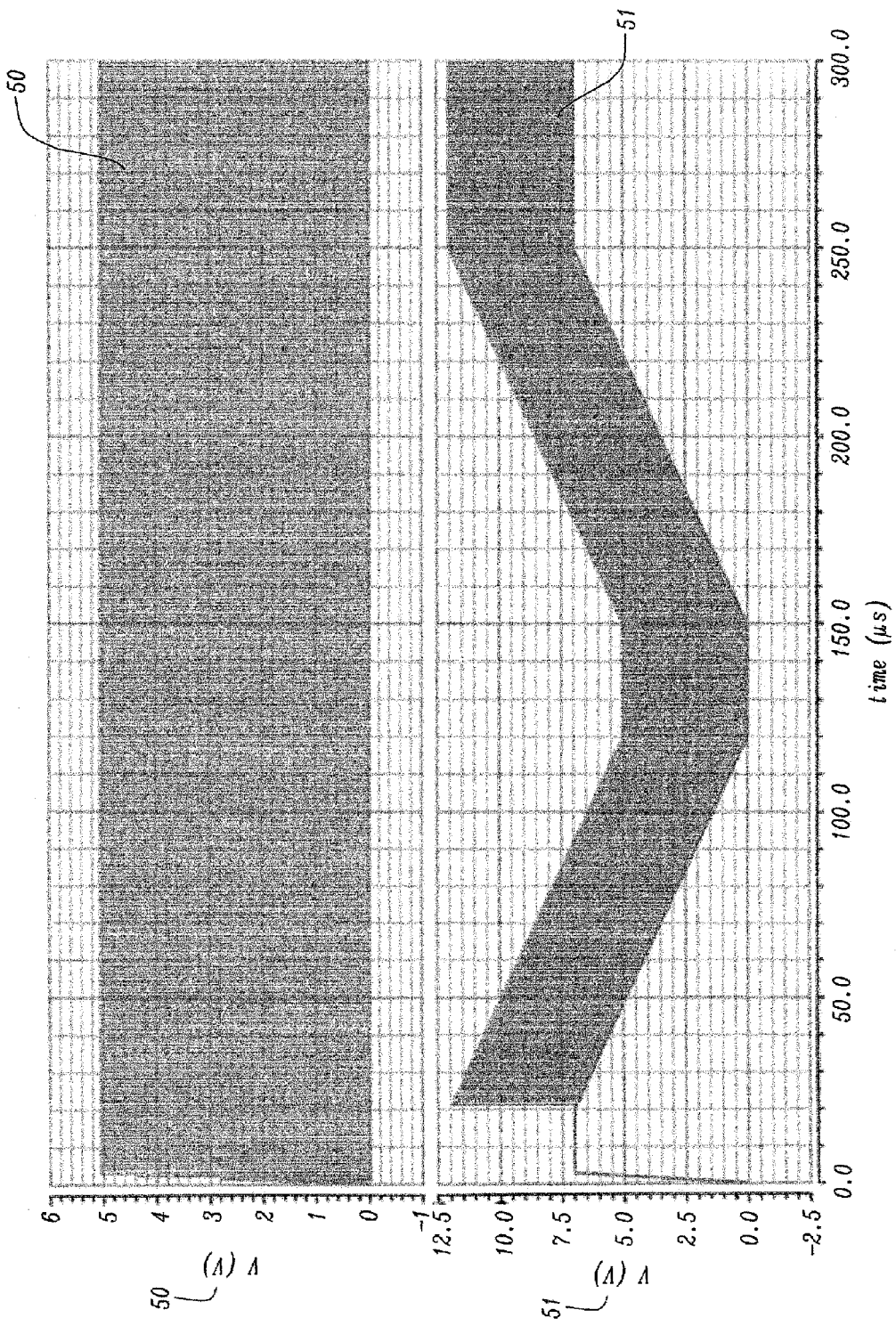
FIG. 5 illustrates simulation results of the level shifter showing input and output signals for ramping down/up Vpwr from 12-5V-12V (VSS2=Vpwr-5V).

It should be noted that in case of a decay of the Vpwr/VSS2 voltage, e.g. caused by a decay of a battery voltage, the proposed dynamic level shifter is able to continue operation even in case VSS2 voltage approaches VDD voltage or falls below VDD as illustrated in FIG. 5.

Figure 6:
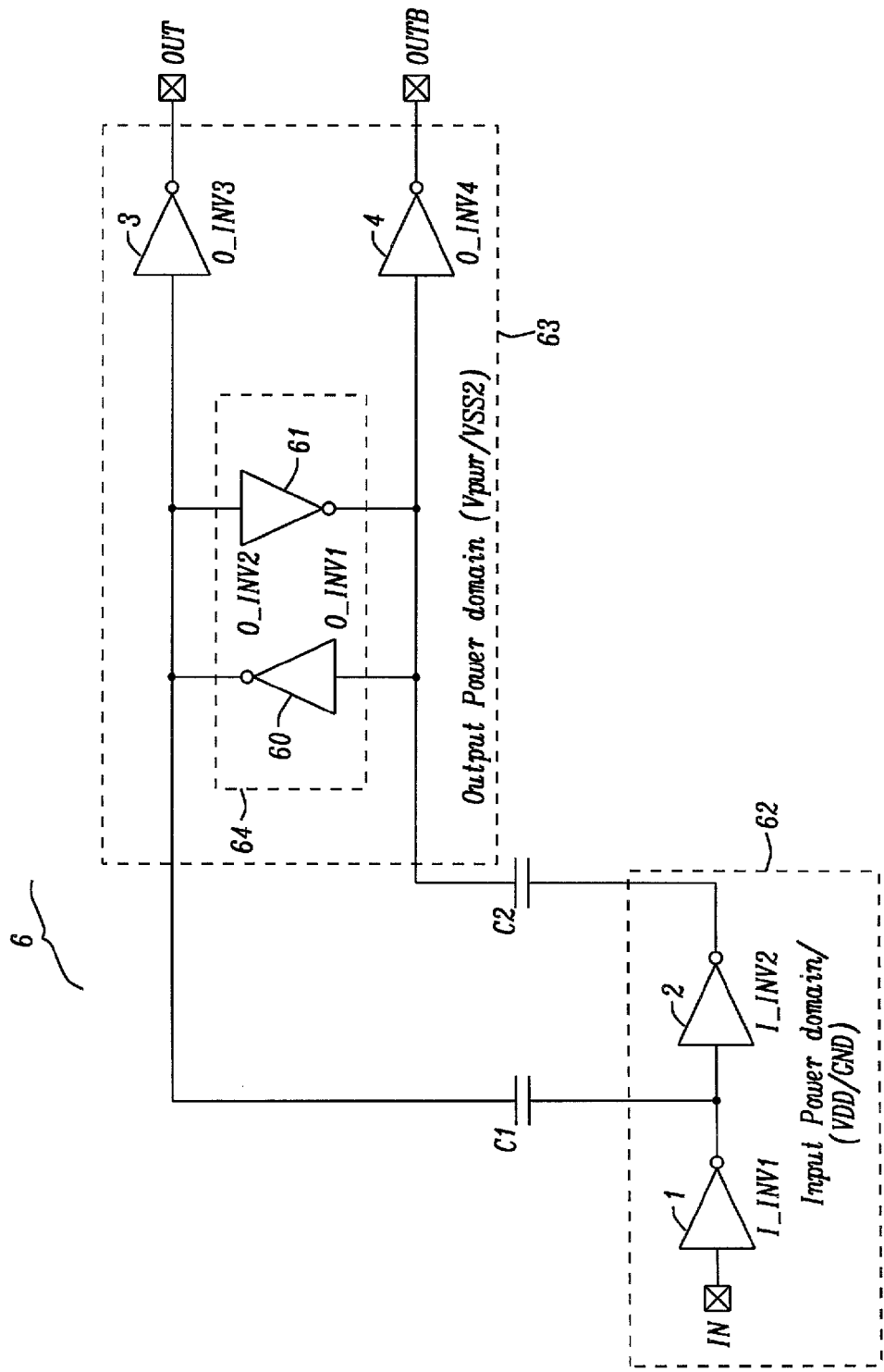
FIG. 6 shows a more general schematic diagram of the preferred embodiment

A more general schematic of the proposed level shifter method is shown in FIG. 6. In the level-shifter 6 of FIG. 6 a latch formed by the cross-coupled P1, P2 and N1, N2 devices from FIG. 1 is replaced by a more general representation of latch 64 comprising two inverters O_INV1 60 and O_INV2 61. This schematic shows a more general description of the proposed circuit. The input power domain VDD/GND 62 and the output power domain Vpwr/VSS2 63 are indicated by dotted lines and power supplies are omitted for clarity. The latch shown in FIG. 1 has been implemented in FIG. 6 by two inverters. Functionality has been also confirmed by simulation. Similar implementation can be shown for a reverse level shifter as shown in FIG. 10.

Figure 10:
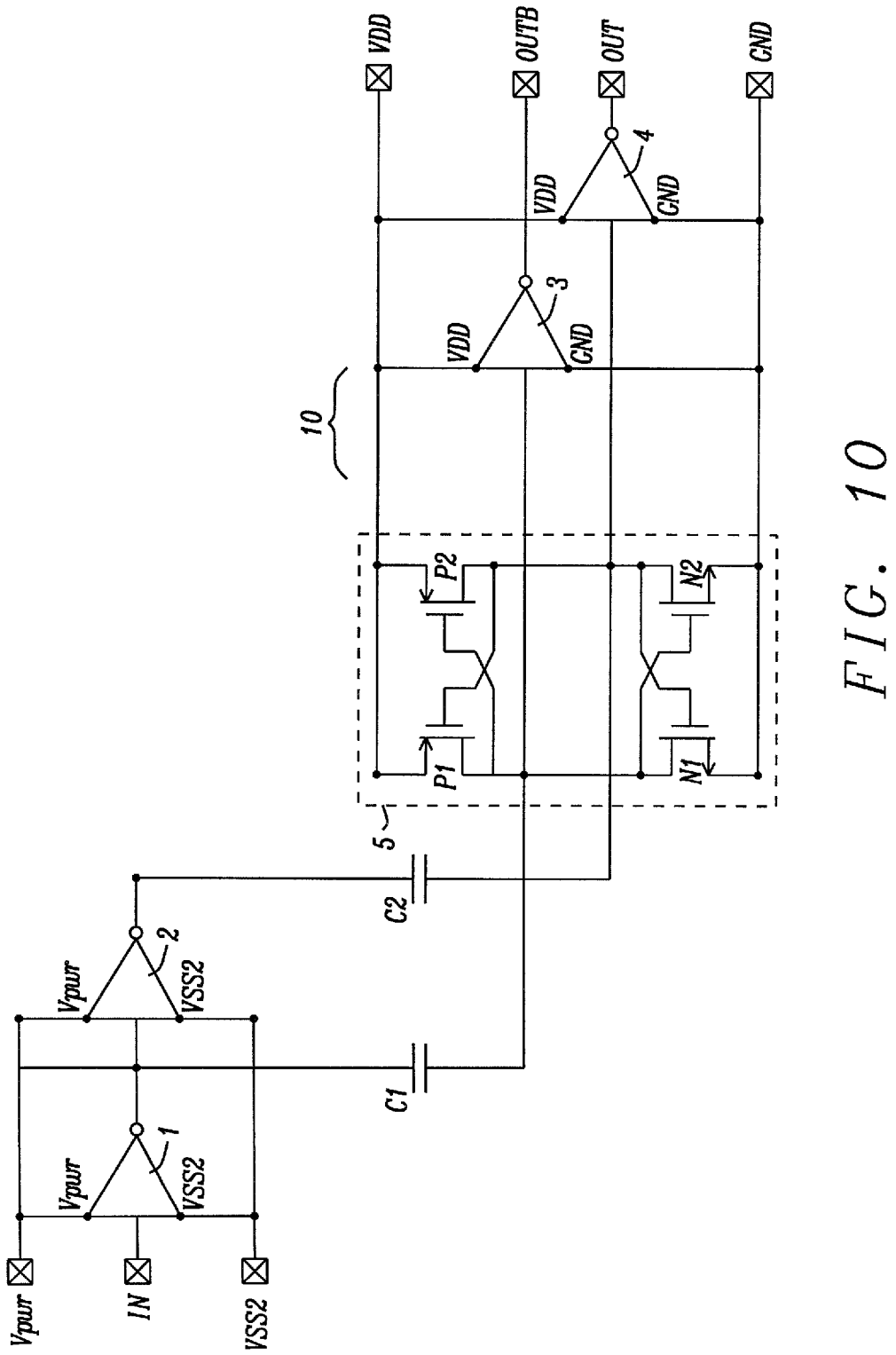
FIG. 10 illustrates a simplified circuit diagram of a dynamic level shifter disclosed performing reverse operation of the present disclosure.

A second embodiment of the invention is shown in FIG. 10. FIG. 10 illustrates a simplified circuit diagram of a dynamic level shifter disclosed performing reverse operation of the present disclosure. While in the circuit shown in FIG. 1 the input signal IN ranges between VDD and Ground voltage levels ranges the input signal IN of the circuit of FIG. 10 between Vpwr and VSS2 voltage levels. Accordingly range the output signals of the circuit of FIG. 10 between VDD and GND. The components of the circuit of FIG. 10, i.e. inverters 1-4, capacitors C1 and C2, and the latch 5 are deployed the same way as in the circuit of FIG. 1.

Figure 7:
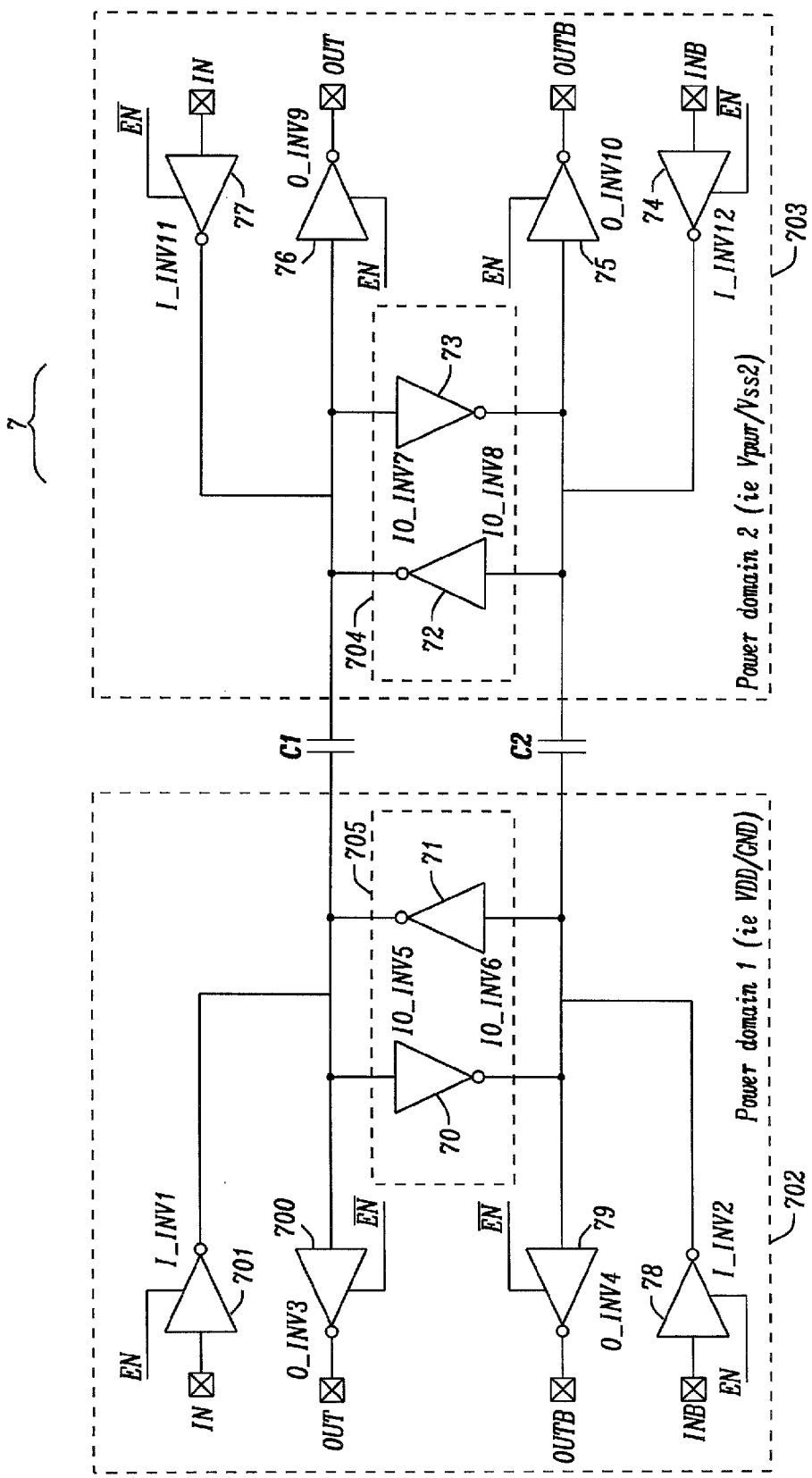
FIG. 7 depicts a general schematic diagram of bidirectional level-shifter.

Another application of the present disclosure is a bidirectional level-shifter 7 as shown in FIG. 7. Bidirectional input/output (I/O) Level-shifter can be configured to level shift signals between two power domains.

Inverters 701 and 78 are each connected to a corresponding signal input port of the power domain VDD/GND. Furthermore the power domain VDD/GND comprises a memory element, as e.g. a latch 705 comprising two converters 70 and 71, connected to level shifting capacitors C1 and C2. Outputs of the latch are buffered through inverters 700 and 79 in the VDD/GND domain Inverters 700 and 79 are each connected to a corresponding signal output port of the power domain VDD/GND.

The Vpwr/VSS2 power domain has a symmetrical structure to the VDD/GND power domain but it is supplied by Vpwr and VSS2 voltage. The power domain Vpwr/VSS2 also comprises a memory element, as e.g. a latch 704 comprising two converters 72 and 73, connected to, in regard of VDD/GND power domain, opposite terminals of the level shifting capacitors C1 and C2.

An enable signal EN signal is used to change direction of level shifting. In one direction the EN signal enables inverters 75, 76, 78, and 701 and the inverted EN signal disables inverters 74, 77, 79, and 700, in the other direction the inverted EN signal enables vice versa inverters 74, 77, 79, and 700 and disables correspondently inverters 75, 76, 78, and 701. The VDD/GND 702 power domain and the Vpwr/VSS2 703 power domain are shown.

Figure 11:
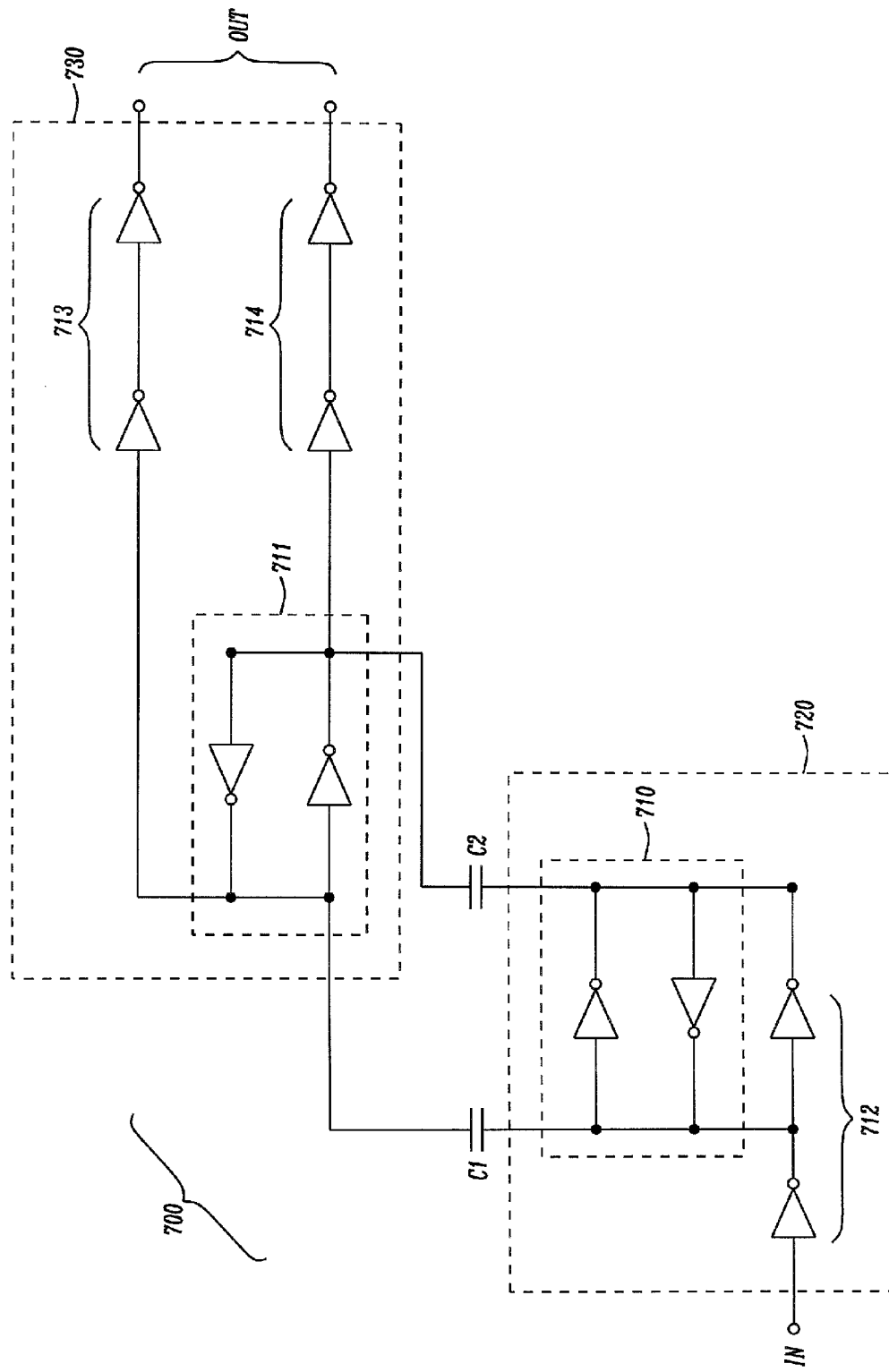
FIG. 11 illustrates a simplified circuit diagram of a one-way dynamic level shifter disclosed having latches at the input terminal and at the output terminals of the level-shifting capacitors.

FIG. 11 illustrates a simplified circuit diagram of a one-way dynamic level shifter disclosed having latches at the input terminal and at the output terminals of the level-shifting capacitors. The level shifter 700 comprises an input power domain 720 and an output power domain 730. The power supplies of both power domains 720 and 730, corresponding to the power supplies shown in FIG. 1, are not shown in FIG. 11 in order to avoid unnecessary complexity of the drawing.

The level shifter 700 of FIG. 11 comprises an input port IN connected to the input buffering/inverting means 712, which is connected to a memory element 710. In a preferred embodiment of the disclosure the memory element 710 is carried out by a latch 710, and buffering/inverting means 712 is been carried out by two inverters connected in series, wherein the output of a first inverter is connected to a first terminal the latch 710 and to the input terminal of the first level shifting capacitor C1 and the output of the second inverter is connected to a second terminal of the latch 710 and to the input terminal of the second level shifting capacitor C2.

The output terminal of the first level shifting capacitor C1 is connected to a first terminal of the memory element 711 and to an input of the output buffering means 713 of a first output branch of the level shifter 700. The output terminal of the second level shifting capacitor C2 is connected to a first terminal of the memory element 711 and to an input of the output buffering means 714 of a second output branch of the level shifter 700. In a preferred embodiment of the disclosure the memory element 711 is carried out by a latch 711, and the buffering/inverting means 713/714 are been carried out by two inverters connected in series.

Figure 2:
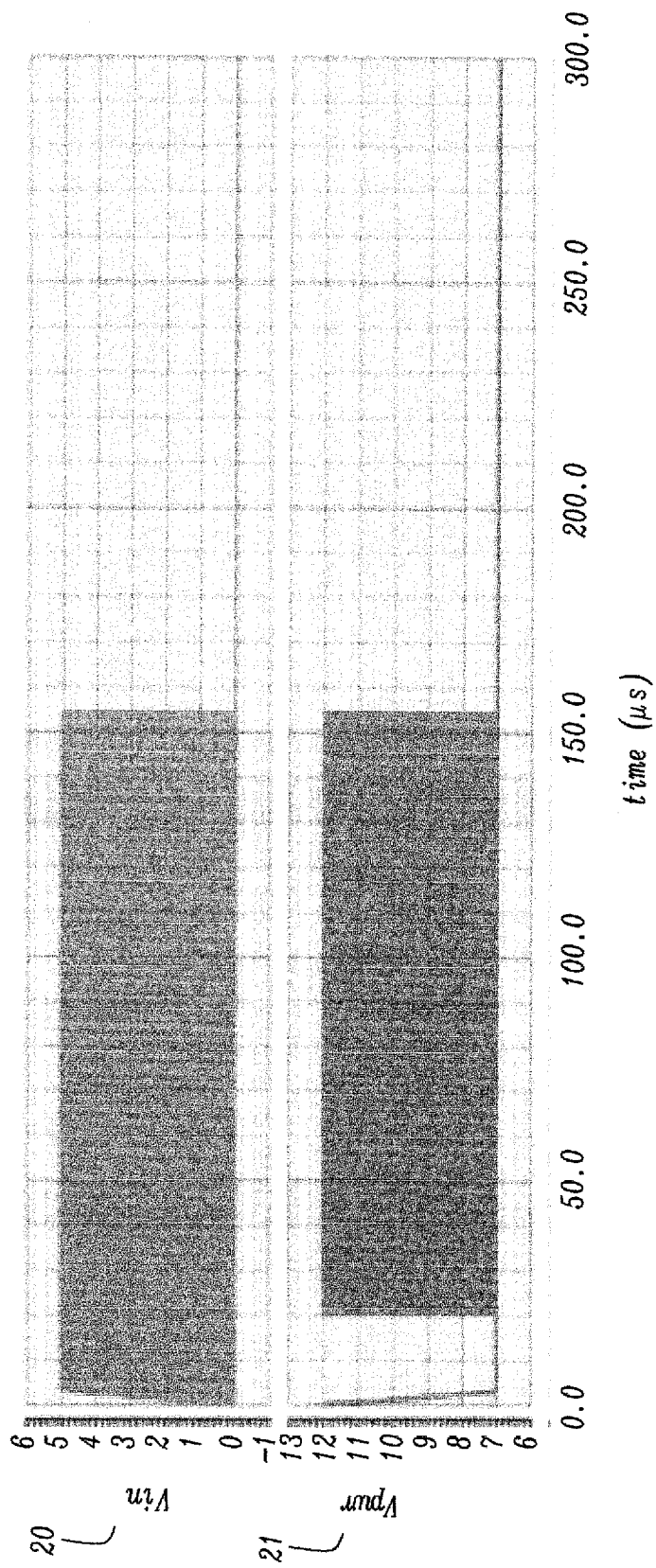

FIG. 2 shows simulation results of the level shifter 10 showing input and output signals for full scale PWM modulated input ramp and level shifter reset signals. Diagram 20 shows input signals ranging from 0-5 Volts, diagram 21 shows output signals ranging from 7-12 Volts.

Figure 3:
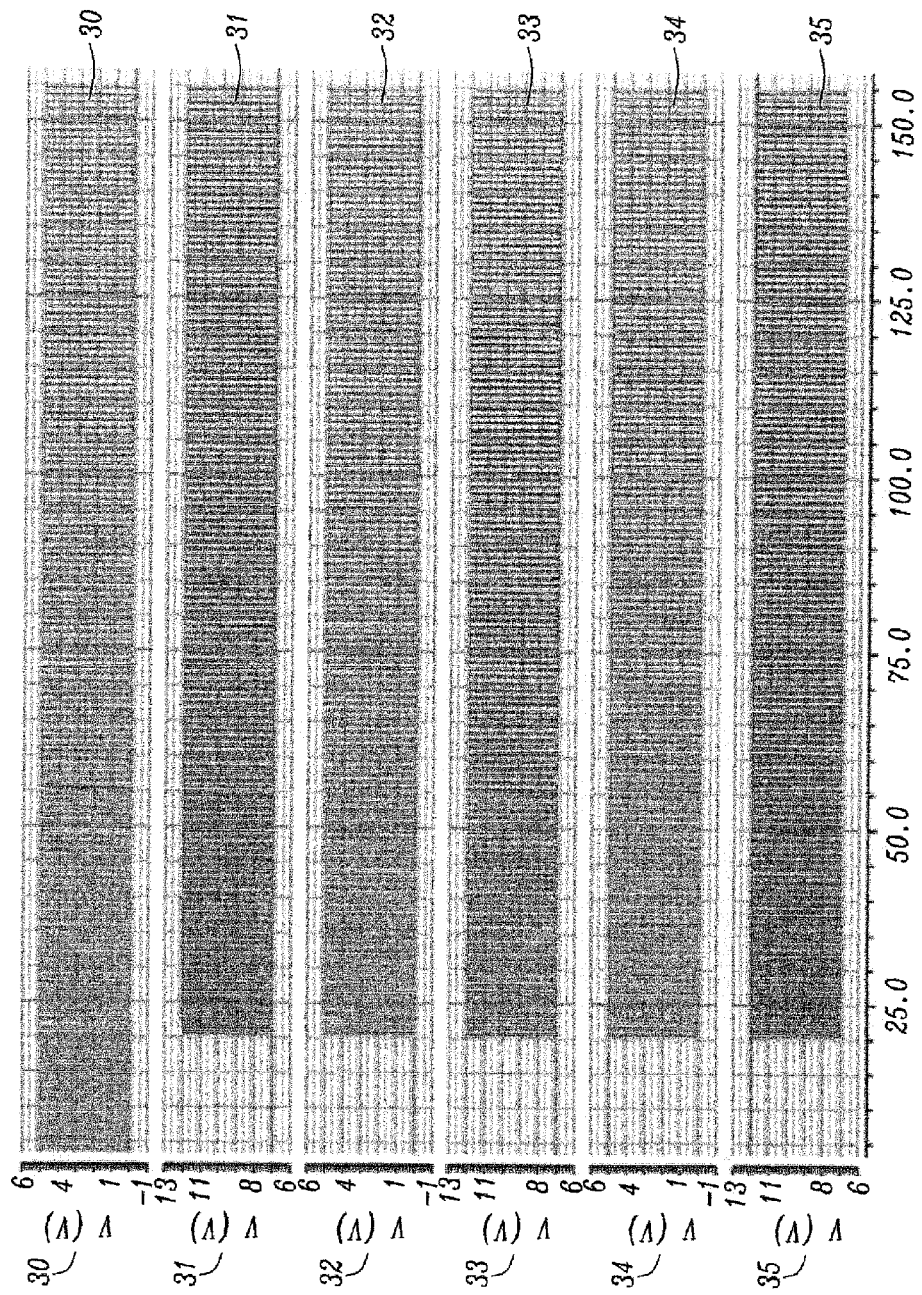

FIG. 3 depicts simulation results of the level shifter 10 showing input and output signals for full scale PWM modulated input ramp and signals on bottom and top plate of the level shifting capacitors. Diagram 30 shows input signals ranging from 0-5 Volts, diagram 31 shows output signals ranging from 7-12 Volts. Diagram 32 shows the signals on the bottom plate of capacitor C1, ranging from 0-5 Volts, diagram 34 shows the signals on the bottom plate of capacitor C2, ranging also from 0-5 Volts, diagram 33 shows the signals on the top plate of capacitor C1, ranging from 7-12 Volts, and diagram 35 shows the signals on the top plate of capacitor C2, ranging from 7-12 Volts.

Figure 4:
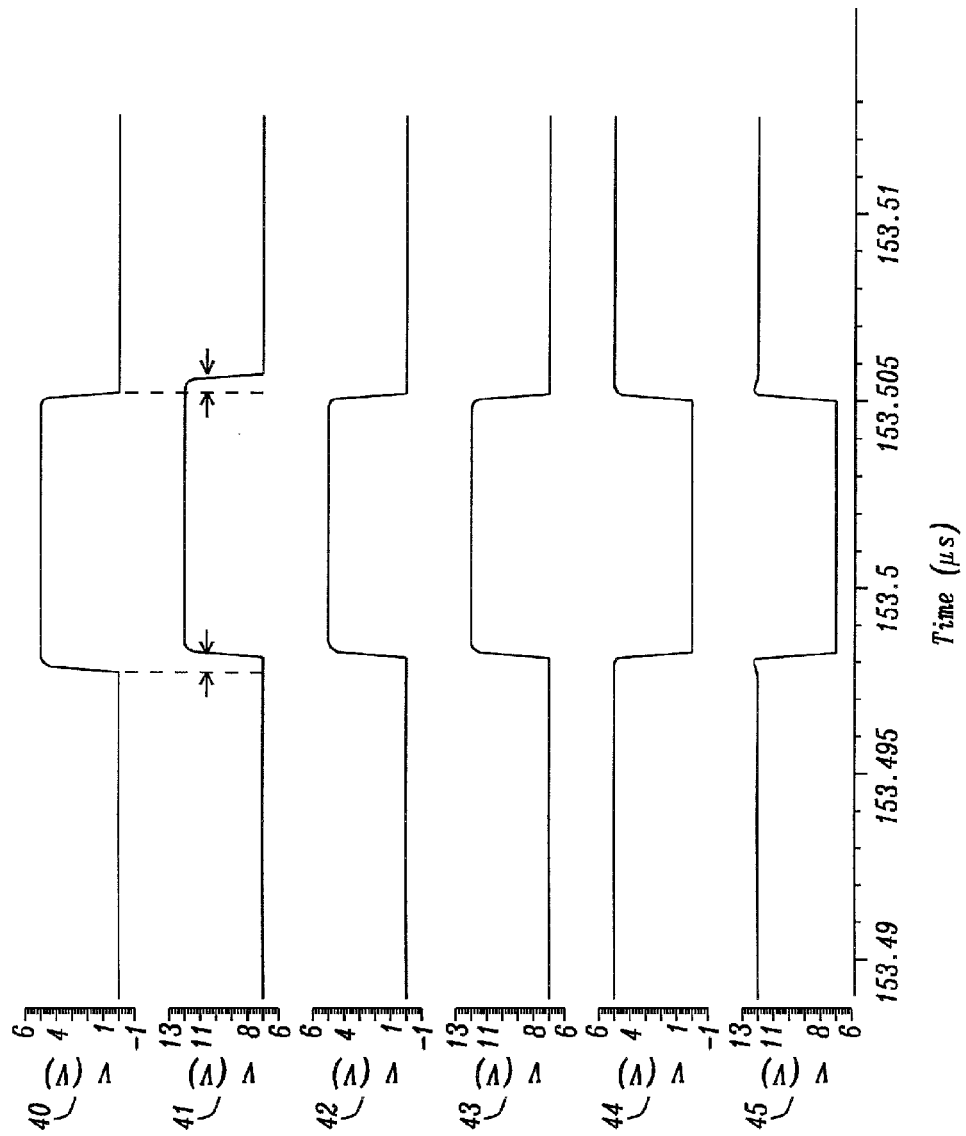

FIG. 4 illustrates simulation results of the level shifter 10 showing transient response time between input and output signals and signals on bottom and top plate of the level shifting capacitors. Diagram 40 shows input signals ranging from 0-5 Volts, diagram 41 shows output signals ranging from 7-12 Volts.

Comparing diagrams 40 and diagram 41 at points of the rising edges of the input and output pulses indicated show a transient time of 696.235 picosecs while the voltage rises from 2.600V to 6.623 V. Furthermore comparing diagrams 40 and diagram 41 at points of the falling edges of the input and output pulses indicated show a transient time of 698.235 picosecs while the voltage falls from maximum 11.5 V to 6.8077 V. This means the output pulse follows the falling edge of the input pulse with a delay of about <1 nsec.

Diagram 42 shows the signals on the bottom plate of capacitor C1, ranging from 0-5 Volts, diagram 44 shows the signals on the bottom plate of capacitor C2, ranging also from 0-5 Volts, diagram 43 shows the signals on the top plate of capacitor C1, ranging from 7-12 Volts, and diagram 45 shows the signals on the top plate of capacitor C2, ranging from 7-12 Volts.

FIG. 5 illustrates simulation results of the level shifter showing input and output signals for ramping down/up Vpwr from 12 to 5V and back to 12V, wherein VSS2=Vpwr-5V. Diagram 50 shows the input signals ranging from 0-5 Volts, diagram 51 shows the output signals ramping down and up again accordingly to the ramping of Vpwr. This time chart shows clearly the circuit disclosed allows variations of VSS2 even below VDD voltage.

FIG. 5 clearly demonstrates a major advantage of the dynamic level shifter. The input signal in the VDD domain is switching between VDD=5V and GND=0V. The power domain ranges from Vpwr=12V to VSS2=Vpwr-5.5V=6.5V (5.5V is to be different from 5V of VDD). The Vpwr is being ramped down from 20 μsec to about 120 μsec. It was held low at 5V same as VDD for another 30 μsec and it started to ramp up from 150 μsec to 250 μsec to original value of 12V. VSS2 in this example has been always constant Vpwr-5.5V except from 120 μsec to 150 μsec where VSS2 was held to ground.

This example and all examples describe using positive VDD and Vpwr values. It has to be noted that that the same principle of the present disclosure can be used successfully if signals Vpwr and VDD are negative.

FIG. 8 illustrates a flowchart of a method to achieve a dynamic level shifter utilizing level shifting capacitors. A first step 80 describes provision of a dynamic level shifter comprising a first power domain receiving a first signal referenced to a first voltage range between a first upper voltage level and a first lower level, a first and a second level shifting capacitor, and a second power domain providing a second signal referenced to a second voltage range between a second upper voltage level and a second lower voltage level. Step 81 shows shifting on a first edge of the input signal a voltage level of a top plate of the first level shifting capacitor from the second lower voltage level to the second upper voltage level and shifting the same time on the first edge of the input signal a voltage level of a top plate of the second level shifting capacitor from the second upper voltage level to the second lower voltage level and shifting on a second edge of the input signal a voltage level of the top plate of the second level shifting capacitor from the second lower voltage level to the second upper voltage level and shifting the same time on a second edge of the input signal a voltage level of the top plate of the first level shifting capacitor from the second upper voltage level to the second lower voltage level and continue by alternately shifting each capacitor high and low with each input signal edge. Step 82 shows providing the level shifted output signal to an output port of the second power domain.

Figure 9:
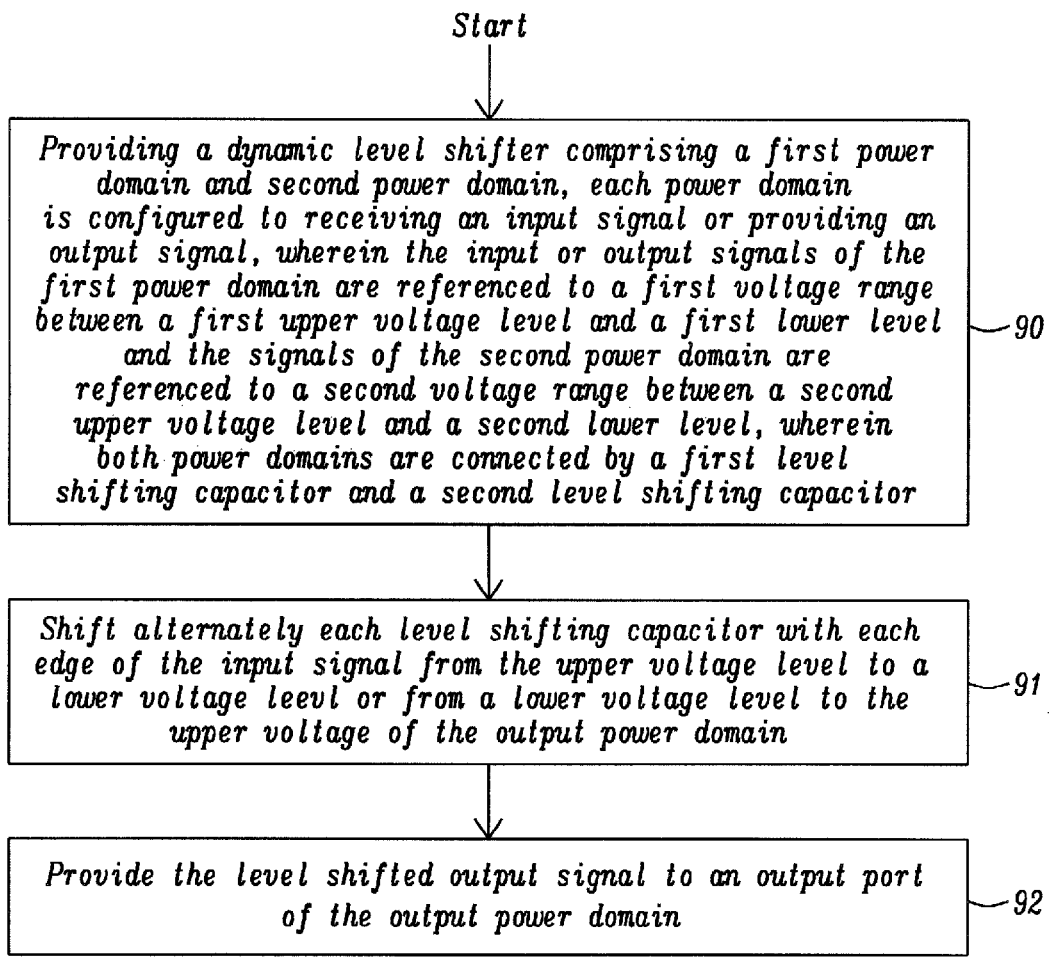
FIG. 9 depicts a flowchart of a method to achieve a dynamic level shifter utilizing level shifting capacitors.

FIG. 9 illustrates a flowchart of a method to achieve a bi-directional dynamic level shifter utilizing level shifting capacitors. A first step 90 describes provision of a dynamic level shifter comprising a first power domain and second power domain, each power domain is configured to receiving an input signal or providing an output signal, wherein the input or output signals of the first power domain are referenced to a first voltage range between a first upper voltage level and a first lower level and the signals of the second power domain are referenced to a second voltage range between a second upper voltage level and a second lower level, wherein both power domains are connected by a first level shifting capacitor and a second level shifting capacitor. Step 91 shows shifting alternately each level shifting capacitor with each edge of the input signal from the upper voltage level to a lower voltage level or from a lower voltage level to the upper voltage of the output power domain. Step 92 shows providing the level shifted output signal to an output port to the output power domain.

What is claimed is:

1. A circuit capable of dynamic bi-directional level shifting, comprising:
two power domains, wherein each power domain is capable of receiving input signals, which are outputted by the other power domain, or providing output signals, which are inputted by the other power domain, each power domain comprising:
two ports for a supply voltage, wherein the supply voltages of each power domain are different;
two ports for input signals, wherein a first of the two ports for input signals is connected to a first buffering means capable of buffering the input signals of the first port and a second of the two ports for input signals is connected to a second buffering means capable of buffering the input signals;
said first and second buffering means capable of buffering the input signals, wherein the first buffering means is connected to a first terminal of a memory element and a second buffering means is connected to a second terminal of the memory element;
two ports for output signals, wherein a first of the two ports for outputs signals is connected to a first buffering means capable of buffering the output signals and a second of the two ports for output signals is connected to a second buffering means capable of buffering the output signals;
said first and second buffering means capable of buffering the output signals, wherein the first buffering means is connected to the first terminal of the memory element and the second buffering means is connected to the second terminal of the memory element; and
said memory element capable of holding a state of a last transition of an input signal if the respective power domain of the memory element is receiving input signals and is capable of holding a state of a last transition of an output signal if the respective power domain of the memory element is providing output signals, wherein the first terminal of the memory element is connected to a first capacitor and the second terminal of the memory element is connected to a second capacitor;

said first capacitor configured to decoupling said first terminals of said memory elements; and
said second capacitor configured to decoupling said second terminals of said memory elements;
wherein at most two capacitors are deployed and the input and output signals of both power domains are configured to switch between an upper and a lower level of the supply voltage of the respective power domain.

2. The circuit of claim 1, wherein each of said memory elements comprises:
a latch capable of holding a state of a last transition of an input signal if the respective power domain of the memory element is receiving input signals and is capable of holding a state of a last transition of an output signal if the respective power domain of the memory element is providing output signals, wherein a first terminal of the latch is connected to an output terminal of the first buffering means connected to the first signal input port of the respective power domain, and to an input terminal of the first buffering means connected to the first signal output port of the respective power domain and wherein a second terminal of the latch is connected to an output terminal of the second buffering means connected to the second signal input port of the respective power domain, and to an input terminal of the second buffering means connected to the second signal output port of the respective power domain.

3. The circuit of claim 1, wherein each memory element comprises a pair of cross-coupled P-type transistors and a pair of cross-coupled N-type transistors, wherein the pairs are connected in parallel.

4. The circuit of claim 2, wherein each latch comprises two inverters wherein a first inverter of the latch has an input connected to the first terminal of the memory element and an output connected to the second terminal of the memory element and the second inverter of the latch has an input connected to the second terminal of the memory element and an output connected to the first terminal of the memory element.

5. The circuit of claim 1, wherein both capacitors are implemented by types of capacitors that are configured to withstand overstress voltages.

6. The circuit of claim 4, wherein both capacitors are metal capacitors.

7. The circuit of claim 1, wherein said first and second buffering means, buffering the input signals, and said first and second buffering means, buffering the output signals, of each power domain, each comprise an inverter, wherein inverters connected to signal input ports of a power domain providing output are disabled during the time the respective power domain provides output, inverters connected to signal output ports of a power domain providing output are enabled during the time the respective power domain provides output, inverters connected to signal input ports of a power domain receiving input are enabled during the time the respective power domain receives input, and inverters connected to signal output ports of the power domain receiving input are disabled during the time the respective power domain receives input.

8. The circuit of claim 7, wherein the enabling/disabling is activated by an enabling signal.

9. A circuit capable of dynamic bi-directional level shifting, comprising:
a first power domain comprising
two ports of the first power domain for a first supply voltage configured to supplying the first power domain;
a first port for signal input of the first power domain, wherein the port is connected to an input terminal of a first inverter of the first power domain;
a second port for signal input of the first power domain, wherein the port is connected to an input terminal of a second inverter of the first power domain;
a first port for signal output of the first power domain wherein the port is connected to an output terminal of a third inverter of the first power domain;
a second port for signal output of the first power domain wherein the port is connected to an output terminal of a fourth inverter of the first power domain;
said first inverter of the first power domain, capable of buffering input signals from the first port for signal input of the first power domain, wherein the first inverter of the first power domain is configured to be enabled by a respective enable signal if input signals are applied to the first port for signal input of the first power domain;
said second inverter of the first power domain, capable of buffering input signals from the second port for signal input of the first power domain, wherein the second inverter of the first power domain is configured to be enabled by a respective enable signal if input signals are applied to the second port for signal input of the first power domain;
said third inverter of the first power domain, capable of buffering output signals to the first port for signal output of the first power domain, wherein the third inverter of the first power domain is configured to be enabled by a respective enable signal if output signals are applied to the first port for signal output of the first power domain;
said fourth inverter of the first power domain, capable of buffering output signals to the second port for signal output of the first power domain, wherein the fourth inverter of the first power domain is configured to be enabled by a respective enable signal if output signals are applied to the second port for signal output of the first power domain;
a latch capable of holding a state of a last transition of an input signal of the first power domain, if the first power domain is receiving input signals and is capable of holding a state of a last transition of an output signal if the first power domain is providing output signals, wherein a first terminal of the latch is connected to a first terminal of a first capacitor, to an output terminal of said first inverter of the first power domain, and to an input terminal of the third inverter of the first power domain and wherein a second terminal of the latch is connected to a first terminal of a second capacitor, to an output terminal of said second inverter of the first power domain, and to an input terminal of the fourth inverter of the first power domain;
a second power domain comprising
two ports of the second power domain for a second supply voltage configured to supplying the second power domain;
a third port for signal input of the second power domain, wherein the port is connected to an input terminal of a fifth inverter;
a fourth port for signal input of the second power domain, wherein the port is connected to an input terminal of a sixth inverter;

a third port for signal output of the second power domain, wherein the port is connected to an output terminal of a seventh inverter;

a fourth port for signal output of the second power domain, wherein the port is connected to an output terminal of an eighth inverter;

said fifth inverter of the second power domain, capable of buffering input signals from the third port for signal input of the second power domain, wherein the fifth inverter of the second power domain is configured to be enabled by a respective enable signal if input signals are applied to the third port for signal input of the second power domain;

said sixth inverter of the second power domain, capable of buffering input signals from the fourth port for signal input of the second power domain, wherein the sixth inverter of the second power domain is configured to be enabled by a respective enable signal if input signals are applied to the fourth port for signal input of the second power domain;

said seventh inverter of the second power domain, capable of buffering output signals to the third port for signal output of the second power domain, wherein the seventh inverter of the second power domain is configured to be enabled by a respective enable signal if output signals are applied to the third port for signal output of the second power domain;

said eighth inverter of the second power domain, capable of buffering output signals to the fourth port for signal output of the second power domain, wherein the eighth inverter of the second power domain is configured to be enabled by a respective enable signal if output signals are applied to the fourth port for signal output of the second power domain;

a latch capable of holding a state of a last transition of an input signal of the second power domain, if the second power domain is receiving input signals and is capable of holding a state of a last transition of an output signal if the second power domain is providing output signals, wherein a first terminal of the latch is connected to a second terminal of the first capacitor, to an output terminal of said fifth inverter of the second power domain, and to an input terminal of the seventh inverter of the second power domain and wherein a second terminal of the latch is connected to a second terminal of the second capacitor, to an output terminal of said sixth inverter of the second power domain, and to an input terminal of the eighth inverter of the second power domain;

said first capacitor; and said second capacitor.

10. The circuit of claim 9, wherein each latch comprises a pair of cross-coupled P-type transistors and a pair of cross-coupled n-type transistors, wherein the pairs are connected in parallel.

11. The circuit of claim 9, wherein each latch comprises two inverters wherein a first inverter of the latch has an input connected to the first terminal of the latch and an output connected to the second terminal of the latch and the second inverter of the latch has an input connected to the second terminal of the latch and an output connected to the first terminal of the latch.

12. The circuit of claim 9, wherein both capacitors are implemented by types of capacitors that are configured to withstand overstress voltages.

13. The circuit of claim 12, wherein both capacitors are metal capacitors.

14. The circuit of claim 9, wherein the input and output signals of the first power domain are configured to switch between an upper level and a lower level of the supply voltage of the first power domain and the input and output signals of the second power domain are configured to switch between an upper level and a lower level of the supply voltage of the second power domain.

15. The circuit of claim 9, wherein, during the time the first power domain receives input signals and the second power domain provides output signals, said first and second inverters buffering the input signals of the first power domain and said seventh and eighth inverters of the second power domain are enabled and the third, the fourth, the fifth, and the sixth inverter are disabled and wherein, during the time the second power domain receives input signals and the first power domain provides output signals, said fifth and sixth inverters, buffering the input signals of the second power domain, and said third and fourth inverters of the first power domain are enabled and the first, the second, the seventh, and the eight inverter are disabled.

16. The circuit of claim 15, wherein the enabling/disabling is activated by an enabling signal.

17. A method for dynamic bi-directional level shifting, the method comprising the steps of:

(1) providing a first and a second power domain, wherein each power domain comprises ports for an own supply voltage, and signal input and signal output ports, signal buffering inverters connected to their correspondent input or output ports and operating in the specific power supply domain and a latch capable of holding a state of a last transition of an input signal, if the respective power domain of the first and second power domains is receiving input signals, and is capable of holding a state of a last transition of an output signal, if the respective power domain of the first and second power domains is providing output signals, wherein both first and second power domains are connected by two level shifting capacitors, wherein each capacitor connects correspondent terminals of the both latches, wherein input and output signals of the first power domain are referenced by a range of the supply voltage of the first power domain and wherein input and output signals of the second power domain are referenced by a range of the supply voltage of the second power domain;

(2) disabling inverters of the power domain receiving the input signals, which are connected to the output ports and inverters of the power domain providing the output signals, which are connected to the input ports, and enabling inverters of the power domain receiving input signals, which are connected to the input ports and inverters of the power domain providing the output signals, which are connected to the output ports;

(3) shifting alternately each signal level shifting capacitor by each edge of the input signal of the power domain receiving the input signals from the upper voltage level to a lower voltage level or from a lower voltage level to the upper voltage of the power domain providing input; and (4) providing the level shifted signal to the power domain providing the output signals wherein the inverters of the power domain providing output switch either to the upper or to the lower voltage level of their supply range and the latch of the power domain providing output signals holds a state of the output signal until a next transition of the output signal.

18. The method of claim 17, wherein an enablement signal enables inverters connected to input or output ports used and disables inverters connected to input or output ports not used.

19. The method of claim 17, wherein the input and output signals of the both power domains switch in a range defined by a range of the correspondent supply voltage of the respective power domain.

* * * * *